(12) United States Patent
Kim et al.

(45) Date of Patent: Nov. 6, 2018
(10) Patent No.: US 10,121,945 B2

(54) SEMICONDUCTOR LIGHT EMITTING DEVICE

(71) Applicant: SAMSUNG ELECTRONICS CO., LTD., Suwon-si, Gyeonggi-do (KR)

(72) Inventors: Jung Sung Kim, Seoul (KR); Chang Su Park, Suwon-si (KR); Jung Kyu Park, Seoul (KR); Tae Young Choi, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/708,794

(22) Filed: Sep. 19, 2017

(65) Prior Publication Data
US 2018/0175265 A1 Jun. 21, 2018

(30) Foreign Application Priority Data
Dec. 16, 2016 (KR) .................. 10-2016-0172480

(51) Int. Cl.
*H01L 33/60* (2010.01)
*H01L 33/50* (2010.01)
*H01L 33/62* (2010.01)
*H01L 33/54* (2010.01)
*H01L 27/15* (2006.01)
*H01L 33/48* (2010.01)

(52) U.S. Cl.
CPC ............ *H01L 33/60* (2013.01); *H01L 27/15* (2013.01); *H01L 33/483* (2013.01); *H01L 33/504* (2013.01); *H01L 33/505* (2013.01); *H01L 33/54* (2013.01); *H01L 33/62* (2013.01)

(58) Field of Classification Search
CPC ..... H01L 33/60; H01L 33/504; H01L 33/483; H01L 27/15; H01L 33/62; H01L 33/505; H01L 33/54
See application file for complete search history.

(56) References Cited

U.S. PATENT DOCUMENTS

| | | | |
|---|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |

(Continued)

FOREIGN PATENT DOCUMENTS

| | | |
|---|---|---|
| JP | 2013-110199 A | 6/2013 |
| KR | 10-2012-0013795 A | 2/2012 |

*Primary Examiner* — John P Dulka
(74) *Attorney, Agent, or Firm* — Lee & Morse, P.C.

(57) ABSTRACT

A semiconductor light emitting device includes: a package body having a cavity, and having a first wiring electrode and a second wiring electrode disposed on a bottom surface of the cavity; a light emitting diode (LED) chip having a first surface with a first electrode and a second electrode thereon, a second surface, and lateral surfaces, the LED chip being mounted in the cavity such that the first surface faces the bottom surface, a wavelength conversion film on the second surface of the LED chip, and including a first wavelength conversion material, and a reflective resin portion in the cavity that surrounds the LED chip.

20 Claims, 10 Drawing Sheets

(56) References Cited

U.S. PATENT DOCUMENTS

| | | |
|---|---|---|
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,896,016 B2 | 11/2014 | Sakaguchi |
| 9,035,345 B2 | 5/2015 | Kim et al. |
| 9,219,208 B2 | 12/2015 | Yoon et al. |
| 9,299,895 B1 | 3/2016 | Hsing Chen et al. |
| 9,379,094 B2 | 6/2016 | Wada et al. |
| 2005/0139846 A1* | 6/2005 | Park .................... H01L 33/62 257/98 |
| 2005/0280041 A1* | 12/2005 | Hashimoto ......... H01L 27/1214 257/213 |
| 2007/0228386 A1* | 10/2007 | Shie ..................... H01L 33/486 257/79 |
| 2014/0071689 A1 | 3/2014 | Yoon et al. |
| 2015/0325758 A1* | 11/2015 | Lin ..................... H01L 33/54 257/98 |
| 2017/0358716 A1* | 12/2017 | Park .................... H01L 33/486 |
| 2018/0040779 A1* | 2/2018 | Baek .................... H01L 33/486 |

* cited by examiner

X1-X1'

SEMICONDUCTOR LIGHT EMITTING DEVICE

CROSS-REFERENCE TO RELATED APPLICATION

Korean Patent Application No. 10-2016-0172480, filed on Dec. 16, 2016, in the Korean Intellectual Property Office, and entitled: "Semiconductor Light Emitting Device," is incorporated by reference herein in its entirety.

BACKGROUND

1. Field

Embodiments relate to a semiconductor light emitting device.

2. Description of the Related Art

Semiconductor light emitting diodes (LEDs) allow a material included therein to emit light using electric energy, e.g., convert electric energy, generated by the recombination of electrons and holes of bonded semiconductors, into light. Such LEDs are widely used as light sources in lighting devices and backlight devices for large liquid crystal displays. Generally, LEDs may be provided as light emitting devices packaged in various forms so as to be easily mounted in application devices.

SUMMARY

According to an example embodiment, a semiconductor light emitting device may include: a package body having a cavity surrounded by a side wall, and having a first wiring electrode and a second wiring electrode on a bottom surface of the cavity; a light emitting diode (LED) chip having a first surface with a first electrode and a second electrode thereon, a second surface opposing the first surface, and lateral surfaces between the first surface and the second surface, the LED chip mounted in the cavity such that the first surface faces the bottom surface; conductive bumps connecting the first electrode and the second electrode to the first wiring electrode and the second wiring electrode, respectively; a wavelength conversion film on the second surface of the LED chip and including a first wavelength conversion material; a light-transmitting bonding layer between the second surface of the LED chip and the wavelength conversion film to bond the LED chip to the wavelength conversion film; a reflective resin portion in the cavity to cover the LED chip, and filling a space between the first surface of the LED chip and the bottom surface of the cavity; and a wavelength conversion resin layer on the wavelength conversion film and the reflective resin portion, and having a light-transmitting resin, the light-transmitting resin including a second wavelength conversion material.

According to an example embodiment, a semiconductor light emitting device may include: a package body having a cavity surrounded by a side wall having a first reflective surface, the first reflective surface being inclined, the package body having a first wiring electrode and a second wiring electrode on a bottom surface of the cavity; a semiconductor light emitting element mounted on the bottom surface of the cavity, and having a first electrode and a second electrode connected to the first wiring electrode and the second wiring electrode, respectively; a reflective resin portion in the cavity to surround the semiconductor light emitting element, having a curved upper surface providing a second reflective surface connected to the first reflective surface, and filling a space between the semiconductor light emitting element and the bottom surface of the cavity; and a wavelength conversion resin layer on the semiconductor light emitting element.

According to an example embodiment, a semiconductor light emitting device may further include: an LED chip having a first surface with a first electrode and a second electrode thereon, the first surface facing the bottom surface of the cavity, a second surface opposing the first surface, and lateral surfaces between the first surface and the second surface; a wavelength conversion film on the second surface of the LED chip, while being below the wavelength conversion resin layer; and a light-transmitting bonding layer between the second surface of the LED chip and the wavelength conversion film to bond the LED chip to the wavelength conversion film, extending to the lateral surfaces of the LED chip, and having a surface inclined toward the bottom surface, wherein the wavelength conversion resin layer may include a first wavelength conversion material, and the wavelength conversion film may include a second wavelength conversion material.

According to an example embodiment, a semiconductor light emitting device may include: a package body having a cavity surrounded by a side wall, and having a first wiring electrode and a second wiring electrode on a bottom surface of the cavity; an LED chip having a first surface with a first electrode and a second electrode thereon, a second surface opposing the first surface, and lateral surfaces between the first surface and the second surface, the LED chip being mounted on the cavity such that the first surface faces the bottom surface; conductive bumps connecting the first electrode and the second electrode to the first wiring electrode and the second wiring electrode, respectively; a wavelength conversion film on the second surface of the LED chip, and including a first wavelength conversion material; a light-transmitting bonding layer between the second surface of the LED chip and the wavelength conversion film to bond the LED chip to the wavelength conversion film, and including a light-transmitting bonding material, the light-transmitting bonding material including a second wavelength conversion material; and a reflective resin portion in the cavity to surround the LED chip, and filling a space between the first surface of the LED chip and the bottom surface of the cavity.

According to an example embodiment, a semiconductor light emitting device may include a package body having a cavity surrounded by a side wall, and having a first wiring electrode and a second wiring electrode on a bottom surface of the cavity, an LED chip having a first surface with a first electrode and a second electrode thereon, a second surface opposing the first surface, and lateral surfaces between the first surface and the second surface, the LED chip being mounted in the cavity such that the first surface of the LED chip faces the bottom surface of the cavity, a wavelength conversion film on the second surface of the LED chip, and including a first wavelength conversion material, and a reflective resin portion in the cavity to surround the LED chip.

BRIEF DESCRIPTION OF DRAWINGS

Features will become apparent to those of skill in the art by describing in detail exemplary embodiments with reference to the attached drawings in which.

DETAILED DESCRIPTION

Figure 1:
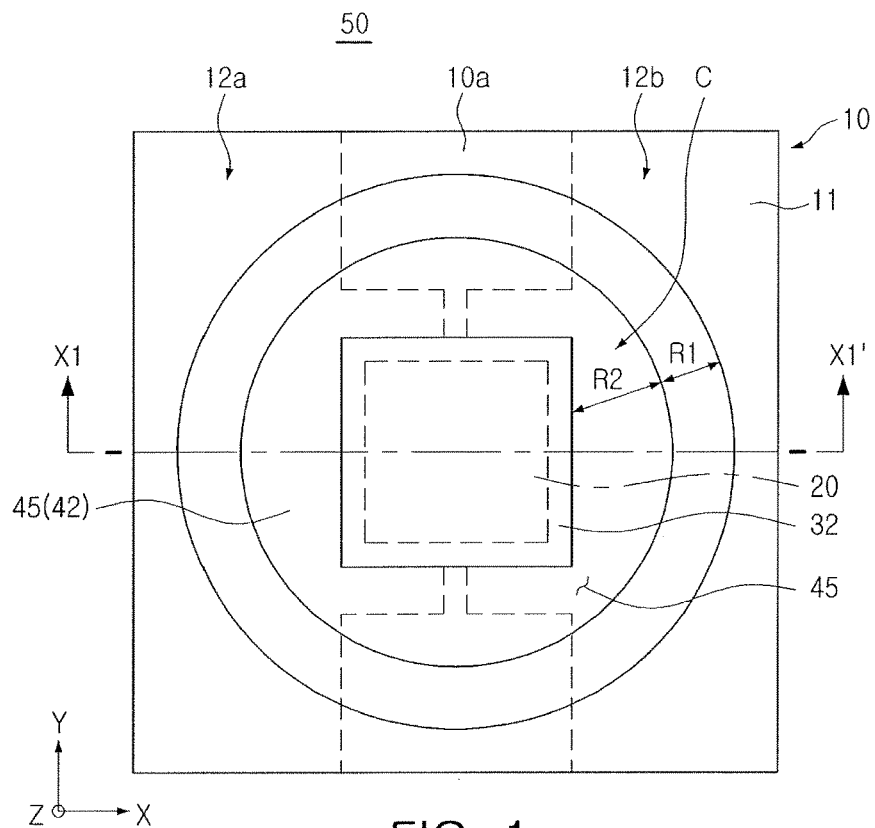
FIG. 1 illustrates a plan view of a semiconductor light emitting device according to an example embodiment.
Figure 2:
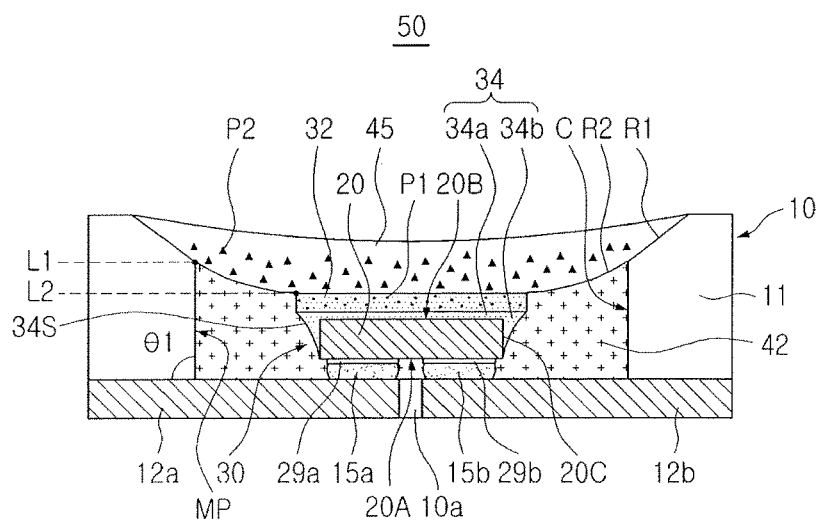
FIG. 2 illustrates a cross-sectional view taken along line X1-X1' of FIG. 1.

FIG. 1 is a plan view of a semiconductor light emitting device according to an example embodiment. FIG. 2 is a cross-sectional view taken along line X1-X1' of FIG. 1. Referring to FIGS. 1 and 2, a semiconductor light emitting device 50 according to an example embodiment may include a package body 10 having a cavity C, a semiconductor light emitting element 30 mounted in the cavity C, and a reflective resin portion 42 surrounding the semiconductor light emitting element 30 in the cavity C.

The package body 10 may have a side wall 11, defining the cavity C. and a first wiring electrode 12a and a second wiring electrode 12b exposed to a bottom surface of the cavity C. Referring to FIG. 1, the planar shape of the cavity C is illustrated as being circular, but is not limited thereto. For example, the planar shape of the cavity C may have a shape corresponding to that of a chip.

The first and second wiring electrodes 12a and 12b may extend to an outer surface of the package body 10, for example, a lower surface or a lateral surface thereof. The package body 10 may be an insulating resin. In some example embodiments, the package body 10 may include a molding resin body in which a reflective powder is dispersed. For example, the reflective powder may include a white ceramic powder such as $TiO_2$, $Al_2O_3$, $Nb_2O_5$, or ZnO. The first and second wiring electrodes 12a and 12b may be a pair of lead frames coupled by a connection portion 10a of the package body 10. The first and second wiring electrodes 12a and 12b may include a metal such as gold (Au), copper (Cu), silver (Ag), or aluminum (Al).

The side wall 11 of the package body 10 and surfaces of the first and second wiring electrodes 12a and 12b may form a relatively large angle θ1 in the cavity C. An increase in the angle θ1 of the side wall 11 may reduce the occurrence of cracking of a molding body in a region in which the package body 10 and the first and second wiring electrodes 12a and 12b contact each other. For example, the angle θ1 of the side wall 11 may be equal to or greater than 80°, and may be substantially 900 in an example embodiment, e.g., substantially vertical.

The semiconductor light emitting element 30 may include a semiconductor light emitting diode (LED) chip 20, a wavelength conversion film 32, and a light-transmitting bonding layer 34. The LED chip 20 may have a first surface 20A and a second surface 20B opposing each other, and lateral surfaces 20C connecting the first and second surfaces 20A and 20B.

As illustrated in FIG. 2, the semiconductor light emitting element 30 may be mounted in the cavity C, such that the first surface 20A of the LED chip 20 may face the bottom surface of the cavity C. The LED chip 20 may include a first electrode 29a and a second electrode 29b disposed on the first surface 20A. The first and second electrodes 29a and 29b may be connected to the first and second wiring electrodes 12a and 12b, using first and second conductive bumps 15a and 15b, e.g., solder bumps.

Figure 3:
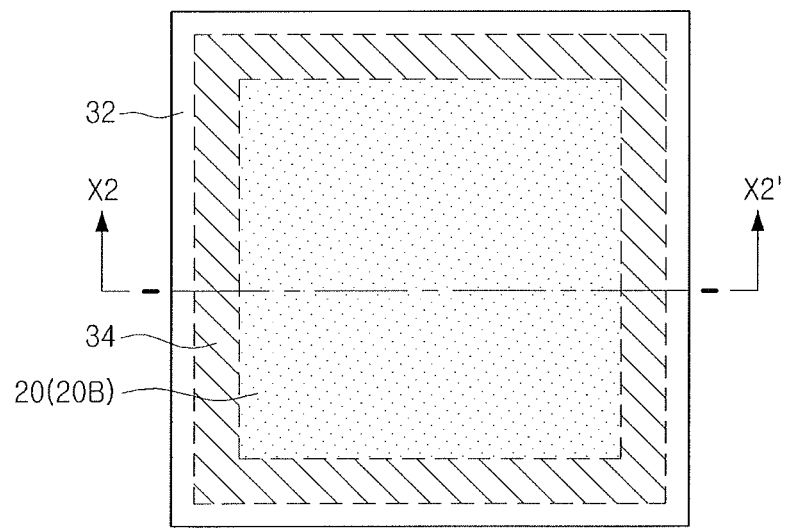
FIG. 3 illustrates a plan view of a light emitting element employable in the semiconductor light emitting device of FIG. 1.
Figure 4:
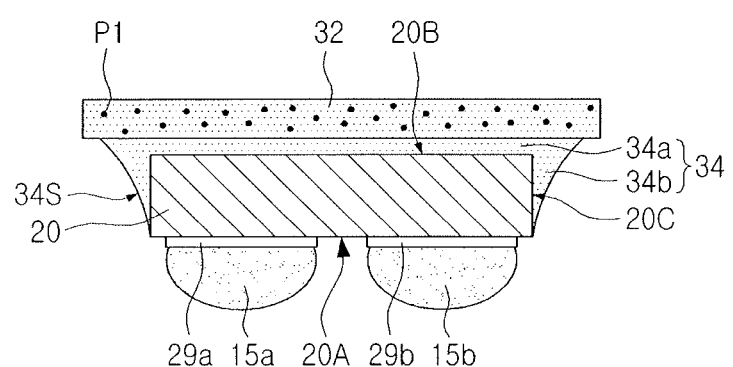
FIG. 4 illustrates a cross-sectional view taken along line X2-X2' of FIG. 3.

Referring to FIGS. 3 and 4, the semiconductor light emitting element 30 employed in this example embodiment may be illustrated as an individual device. In this example embodiment, the semiconductor light emitting element 30 may be manufactured to have the form thereof illustrated in FIG. 4, and then mounted in the package body 10. Alternatively, a method of mounting the LED chip 20 in the package body 10 and then adding other components, e.g., a wavelength conversion film or the like, of the semiconductor light emitting element 30, may be used (refer to FIGS. 6A through 6E).

As illustrated in FIG. 4, the semiconductor light emitting element 30 may include the wavelength conversion film 32 on the second surface 20B of the LED chip 20 and the light-transmitting bonding layer 34 bonding the LED chip 20 to the wavelength conversion film 32.

The wavelength conversion film 32 may include a first wavelength conversion material P1 converting a portion of light, emitted by the LED chip 20, into light having a first wavelength different from that of the emitted light. The wavelength conversion film 32 may be a resin layer or a ceramic phosphor film in which the first wavelength conversion material P1 is dispersed. For example, the wavelength conversion film 32 may be a glass layer including the first wavelength conversion material P1 such as a phosphor or a quantum dot (QD).

The wavelength conversion film 32 may be wider than the LED chip 20, e.g., wider in both the x and y directions. The wavelength conversion film 32 may cover, e.g., completely cover, the second surface 20B of the LED chip 20. As illustrated in FIG. 3, the wavelength conversion film 32 may have an outer circumferential or peripheral region surrounding the LED chip 20 without covering the LED chip 20, and the light-transmitting bonding layer 34 may extend along the outer circumferential region. In other words, the wavelength conversion film 32 may not overlap the LED chip 20 along the z direction, while the light-transmitting bonding layer 34, which is between the second surface 20B of the LED chip 20 and the wavelength conversion film 32, may extend along the z direction towards the first surface 20A of the LED chip 20, e.g., may contact, e.g., directly contact, the lateral surfaces 20C of the LED chip 20. A width of the light-transmitting bonding layer 34 may gradually decrease from that of the wavelength conversion film 32 to that of the LED chip 20.

The light-transmitting bonding layer 34 employed in this example embodiment may have a bonding region 34a between the wavelength conversion film 32 and the LED chip 20, and a lateral extending region 34b disposed along the lateral surfaces 20C of the LED chip 20, as illustrated in FIG. 4. The lateral extending region 34b may extend to the lateral surfaces 20C of the LED chip 20, and may have a surface 34S inclined toward the bottom surface of the cavity C.

The lateral extending region 34b may have a width that increases toward the wavelength conversion film 32. The sectional shape of the lateral extending region 34b may vary according to the viscosity or amount of a resin for the light-transmitting bonding layer 34 (refer to FIGS. 6B and 6C). For example, the light-transmitting bonding layer 34 may include silicone, epoxy, polyacrylate, polyimide, polyamide, or benzocyclobutene.

As illustrated in FIG. 2, the semiconductor light emitting element 30 may be mounted in the cavity C and may be surrounded by the reflective resin portion 42. The reflective resin portion 42 may be formed of a light-transmitting resin including a reflective powder. The lateral extending region 34b employed in this example embodiment may be formed of a light-transmitting resin including a wavelength conversion material. For example, the light-transmitting resin may be a silicone resin having a refractive index from 1.38 to 1.8. The reflective powder may be a white ceramic powder or a metallic powder. For example, the white ceramic powder may include at least one of $TiO_2$, $Al_2O_3$, $Nb_2O_5$, and ZnO. The metallic powder may include a material such as aluminum (Al) or silver (Ag).

In this example embodiment, the reflective resin portion 42 may have an interface at the light-transmitting bonding layer 34. The interface may be provided along the inclined surface 34S of the lateral extending region 34b and may act as a reflective surface with respect to light travelling in a lateral direction of the LED chip 20. For example, the interface may reflect light, travelling in the lateral direction of the LED chip 20, toward the wavelength conversion film 32, and may improve light extraction efficiency of the semiconductor light emitting device 50.

The reflective resin portion 42 may be formed between the first surface 20A of the LED chip 20 and the bottom surface of the cavity C to surround the first and second conductive bumps 15a and 15b. As described above, use of the reflective resin portion 42 may prevent light from being absorbed by the first and second conductive bumps 15a and 15b. In addition, the reflective resin portion 42 may substantially fill a space between the first surface 20A of the LED chip 20 and the bottom surface of the cavity C to guide light, travelling downwardly, in a desired light extraction direction (for example, a direction of the wavelength conversion film 32). In this example embodiment, as illustrated in FIG. 2, the side wall 1 of the package body 10 may have a first reflective surface R1 which is inclined. In other words, the side wall 11 may have a main portion MP having the relatively large angle with respect to the first and second wiring electrodes and a first reflective surface R1 extending from the main portion MP away from the cavity C, e.g., the main portion MP may be a surface at the side wall having the relatively large angle θ1.

An upper surface of the reflective resin portion 42 may be provided as a second reflective surface R2 connected to the first reflective surface R1. The first and second reflective surfaces R1 and R2 may have a relatively low inclination angle to facilitate light extraction. For example, the inclination angle of the first and second reflective surfaces R1 and R2 may range from 20° to 40°. For example, the inclination angle of the first and second reflective surfaces R1 and R2 may be set to be different from each other.

The reflective resin portion 42 may be formed using a curing process of a liquid resin. Thus, the second reflective surface R2 may have a curved surface similar to a meniscus shape. In order to provide the second reflective surface R2, a first level L1 of the upper surface of the reflective resin portion 42, adjacent to the side wall 11, may be higher than a second level L2 thereof adjacent to the semiconductor light emitting element 30. The second level L2 may be determined by an upper surface of the wavelength conversion film 32, while the first level L1 may be determined by the main portion MP of the side wall 11. In other words, the main portion MP of the side wall 11 extending up the incline of the side wall. e.g., the first reflective surface R1, extends higher along the z direction than the wavelength conversion film 32, such that the reflective resin portion 42 between the wavelength conversion film 32 and the side wall 11 extends farther along the z direction than the wavelength conversion 32. Thus, the a portion of the upper surface of the reflective resin portion 42 contacting the side wall 11 may be higher than the upper surface of the reflective resin portion 42 adjacent to the LED chip, e.g., an upper surface of the reflective resin portion 42 extending between the main portion MP of the side wall 11 and the LED chip 20 is higher than the LED chip 20.

Referring to FIG. 2, a wavelength conversion resin layer 45 may be on the wavelength conversion film 32. The wavelength conversion resin layer 45 may extend to at least a portion of the upper surface of the reflective resin portion 42, e.g., may cover an entirety of the upper surface of the reflective resin portion 42. The wavelength conversion resin layer 45 may extend to an upper surface of the side wall 11.

The wavelength conversion resin layer 45 may be formed of a light-transmitting resin including a second wavelength conversion material P2. The second wavelength conversion material P2 may be a phosphor or a quantum dot(QD) converting a portion of light, emitted by the LED chip 20, into light having a second wavelength different from that of the emitted light. The second wavelength conversion material P2 may convert light having a wavelength into light having a shorter wavelength than that of light converted by the first wavelength conversion material P1.

For example, the semiconductor light emitting element 30 may emit white light. In some example embodiments, the LED chip 20 may emit blue light. For example, the LED chip 20 may emit light having a dominant wavelength from 440 nm to 460 nm. The first wavelength conversion material P1 may be a phosphor, e.g., a red phosphor, or a QD converting a portion of blue light into red light. The second wavelength conversion material P2 may be a phosphor, e.g., at least one of a yellow phosphor or a green phosphor, or a QD converting a portion of blue light into yellow and/or green light.

The wavelength conversion film 32 employed in this example embodiment may have a certain degree of light transmittance to transmit light, emitted by the LED chip 20, to the wavelength conversion resin layer 45. A desired light transmittance of the wavelength conversion film 32 may be obtained by appropriately adjusting the content of the first wavelength conversion material P1. For example, the first wavelength conversion material P1 included in the wavelength conversion film 32 may be contained in an amount of 5 vol % to 30 vol %.

Figure 5:
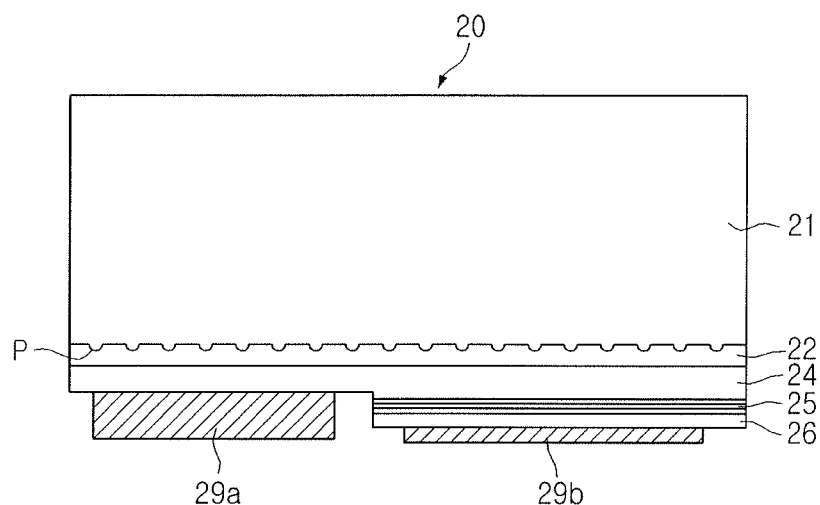
FIG. 5 illustrates a cross-sectional view of a light emitting device (LED) chip employable in the light emitting element of FIG. 3.

An example of the LED chip 20 employable in this example embodiment is illustrated in FIG. 5. Referring to FIG. 5, the LED chip 20 may include a substrate 21, a first conductive semiconductor layer 24, an active layer 25, and a second conductive semiconductor layer 26, disposed sequentially on the substrate 21.

The substrate 21 may be an insulating substrate such as a sapphire substrate, but is not limited thereto. The substrate 21 may be an insulating substrate, a conductive substrate, or a semiconductor substrate. For example, the substrate 21 may include sapphire, SiC, Si, $MgAl_2O_4$, MgO, $LiAlO_2$, $LiGaO_2$, or GaN. An unevenness pattern P may be formed on an upper surface of the substrate 21. The unevenness pattern P may increase light extraction efficiency and improve the quality of a single crystal being grown.

A buffer layer 22 may be between the substrate 21 and the first conductive semiconductor layer 24. The buffer layer 22 may have a composition of $In_xAl_yGa_{1-x-y}N$ ($0 \leq x \leq 1$, $0 \leq y \leq 1$). For example, the buffer layer 22 may include GaN, AlN, AlGaN, or InGaN. In some example embodiments, the buffer layer 22 may also be formed by combining a plurality of layers or gradually changing a composition thereof.

The first conductive semiconductor layer 24 may be a nitride semiconductor layer having a composition of n-type $In_xAl_yGa_{1-x-y}N$ ($0 \leq x < 1$, $0 \leq y < 1$, $0 \leq x+y < 1$), and an n-type impurity may be silicon (Si). For example, the first conductive semiconductor layer 24 may include n-type GaN. The second conductive semiconductor layer 26 may be a nitride semiconductor layer having a composition of p-type $In_xAl_yGa_{1-x-y}N$ ($0 \leq x < 1$, $0 \leq y < 1$, $0 \leq x+y < 1$), and a p-type impurity may be magnesium (Mg). In another example embodiment, the second conductive semiconductor layer 26 may have a multilayer structure having different compositions with respect to one another.

The active layer 25 may have a multiple quantum well (MQW) structure in which quantum well layers and quantum barrier layers are alternately stacked on each other. For example, the quantum well layers and the quantum barrier layers may include different compositions of $In_xAl_yGa_{1-x-y}N$ ($0 \leq x \leq 1$, $0 \leq y \leq 1$, $0 \leq x+y \leq 1$), respectively. In an example embodiment, the quantum well layers may include a composition of $In_xGa_{1-x}N$ ($0 < x \leq 1$), and the quantum barrier layers may include GaN or AlGaN. The thicknesses of the quantum well layers and the quantum barrier layers may range from 1 nm to 50 nm, respectively. The active layer 25 is not limited to being an MQW structure, and may also have a single quantum well (SQW) structure.

The first and second electrodes 29a and 29b may be on a mesa etched region of the first conductive semiconductor layer 24 and the second conductive semiconductor layer 26, respectively, to be located on the same surface (the first surface 20A). In particular, the first conductive layer 24 may be etched to provide a mesa on which the first electrode 29a may be mounted directly thereon, e.g., the active layer 25 and the second conductive semiconductor layer 26, while the second electrode 29b may be directly on second conductive semiconductor layer 26.

The first electrode 29a may include at least one of silver (Ag), nickel (Ni), aluminum (Al), chromium (Cr), rhodium (Rh), palladium (Pd), iridium (Ir), ruthenium (Ru), magnesium (Mg), zinc (Zn), platinum (Pt), or gold (Au), and may be employed as a structure having a single layer or two or more layers. The second electrode 29b may include at least one of aluminum (Al), gold (Au), chromium (Cr), nickel (Ni), titanium (Ti), or tin (Sn). In some example embodiments, the second electrode 29b may be a transparent electrode formed, using a material such as a transparent conductive oxide or a transparent conductive nitride, or may include graphene.

FIGS. 6A through 6E are cross-sectional views of a method of manufacturing the semiconductor light emitting device illustrated in FIG. 1.

Figure 6A:
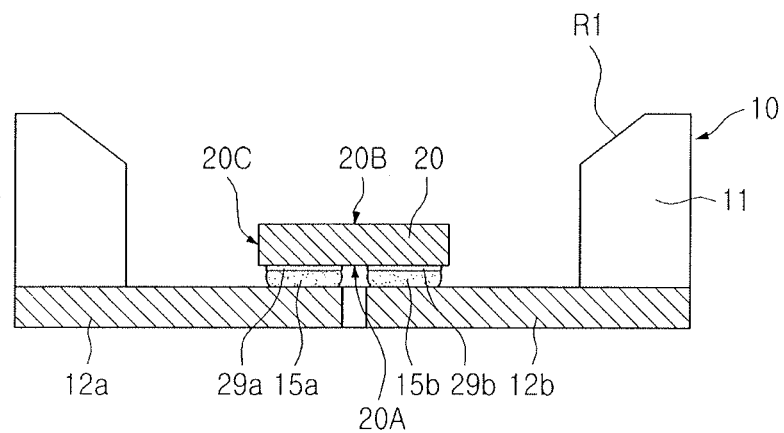
FIGS. 6A through 6E illustrate cross-sectional views of a method of manufacturing the semiconductor light emitting device of FIG. 1.

Referring to FIG. 6A, the LED chip 20 may be mounted in the cavity C of the package body 10. The LED chip 20 may be mounted such that the first surface 20A may face the bottom surface of the cavity C. The first and second electrodes 29a and 29b positioned on the first surface 20A of the LED chip 20 may be connected to the first and second wiring electrodes 12a and 12b, using the first and second conductive bumps 15a and 15b such as a solder ball.

Figure 6B:
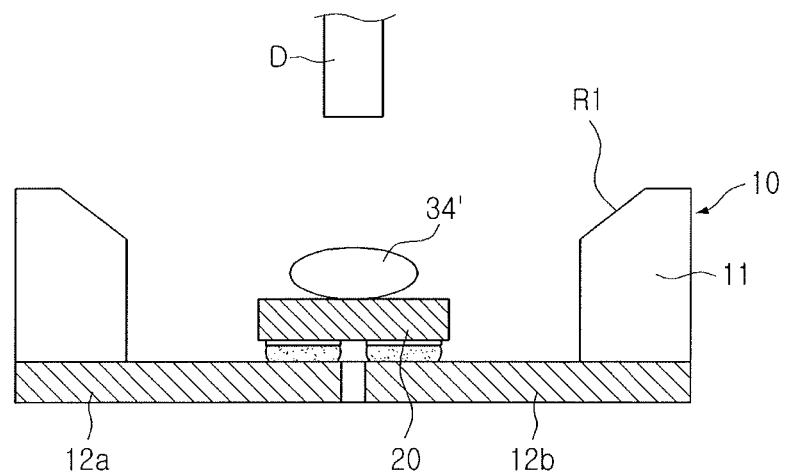

Referring to FIG. 6B, a bonding resin 34', in a non-cured state, may be dripped on the second surface 20B of the LED chip 20. Such a dripping process may be performed using a dispensing device D. The bonding resin 34' may include silicone, epoxy, or a combination thereof. In the dripping process, the bonding resin 34' may be dripped in an amount greater than that required for bonding. For example, in a subsequent bonding process, the bonding resin 34' may be provided in an amount sufficient to allow a portion of the bonding resin 34' to flow along the lateral surfaces 20C of the LED chip 20 so as to form an inclined portion. The bonding resin 34' may include a powder-type light dispersion material, e.g., a light-dispersing powder. For example, the powder-type light dispersion material may include $SiO_2$, $TiO_2$, or $Al_2O_3$.

Figure 6C:
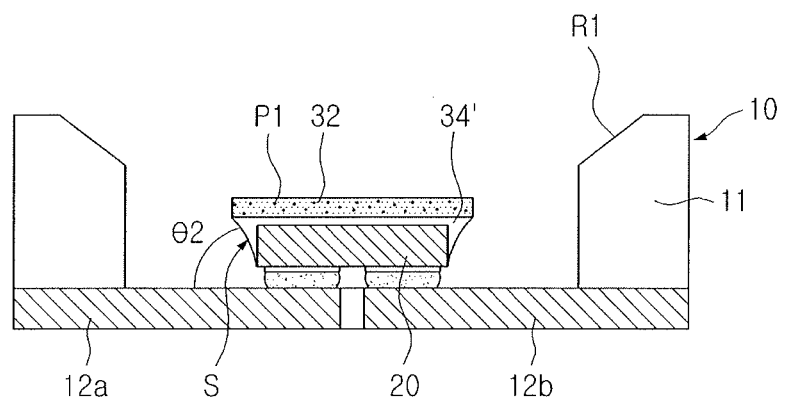

Referring to FIG. 6C, the wavelength conversion film 32 may be disposed on the second surface 20B of the LED chip 20 on which the bonding resin 34' has been dripped. The wavelength conversion resin layer 32 may include the first wavelength conversion material P1. In the disposition process of the wavelength conversion film 32, a portion of the bonding resin 34' may flow along the lateral surfaces 20C of the LED chip 20, and the portion of the bonding resin 34', which has flowed until the bonding resin 34' is cured, may be maintained, while forming the inclined surface S on the lateral surfaces 20C of the LED chip 20 by surface tension.

The shape of the inclined surface S may be adjusted according to the viscosity of the bonding resin 34' or the area of an outer circumferential region (an outer portion of the LED chip 20) of the wavelength conversion film 32. For example, an inclination angle θ2 with respect to the bottom surface of the cavity may be reduced and the portion of the bonding resin 34' forming the inclined surface may be extended by expanding the outer circumferential region, using the wavelength conversion film 32 having a large area, and by increasing the viscosity of the bonding resin 34' to an appropriate level.

Figure 6D:
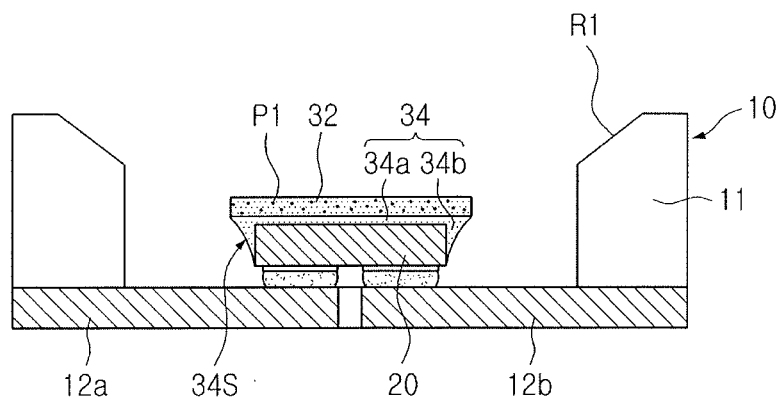

Referring to FIG. 6D, the bonding resin 34' may be cured such that the wavelength conversion film 32 may be bonded to the second surface 20B of the LED chip 20. In the curing process, the bonding resin 34' may be cured to form the light-transmitting bonding layer 34. The light-transmitting bonding layer 34 may include the bonding region 34a disposed between the wavelength conversion film 32 and the LED chip 20.

In addition, the portion of the bonding resin 34', which has flowed along the lateral surfaces 20C of the LED chip 20 in an inclined manner, may be provided as the lateral extending region 34b. The lateral extending region 34b may be positioned on the lateral surfaces 20C of the LED chip 20, and may provide the inclined surface 34S toward the bottom surface of the cavity C. According to the example embodiment, the lateral extending region 34b may provide the inclined surface 34S suitable for light extraction to reduce total internal reflection on the lateral surfaces 20C of the LED chip 20, thus improving light extraction efficiency.

Figure 6E:
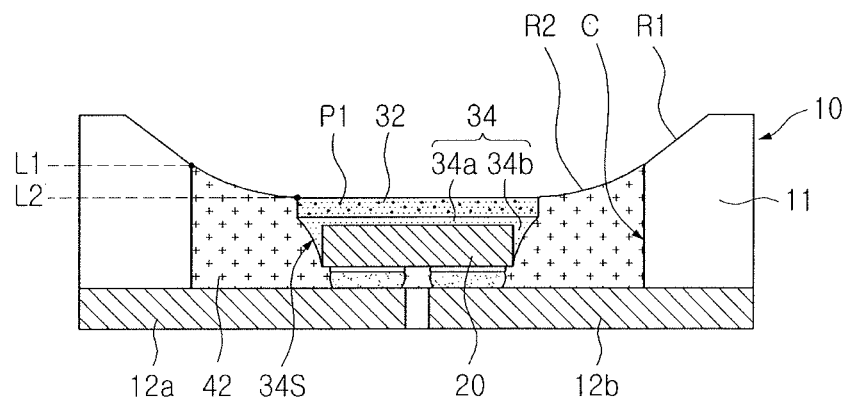

Referring to FIG. 6E, the reflective resin portion 42 may be formed in the cavity C to surround the LED chip 20. The reflective resin portion 42 may form an inclined interface at the lateral extending region 34b of the light-transmitting bonding layer 34, and the inclined interface may be provided as a reflective surface guiding light toward the wavelength conversion film 32. The reflective resin portion 42 may be formed of a light-transmitting resin including a reflective powder. For example, the reflective powder may be a white ceramic powder including at least one of $TiO_2$, $Al_2O_3$, $Nb_2O_5$, or ZnO.

The wavelength conversion resin layer 45 may additionally be formed on the wavelength conversion film 32 of the product illustrated in FIG. 6E, and the semiconductor light emitting device 50 illustrated in FIG. 2 may thus be manufactured. The wavelength conversion resin layer 45 may be formed of a light-transmitting liquid resin containing the second wavelength conversion material P2. The formation of the wavelength conversion resin layer 45 may be performed using the dispensing process.

Figure 7:
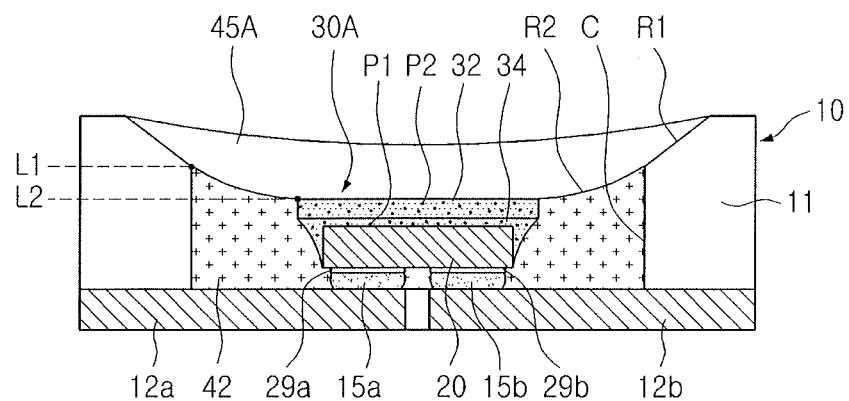
FIG. 7 illustrates a cross-sectional view of a semiconductor light emitting device according to an example embodiment.
Figure 8:
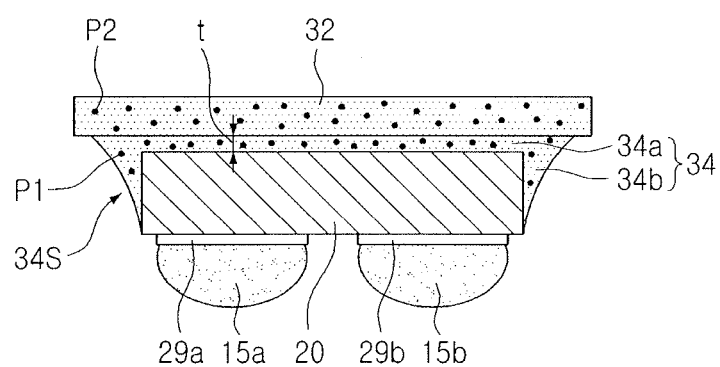
FIG. 8 illustrates a cross-sectional view of a light emitting element employable in the semiconductor light emitting device of FIG. 7.

FIG. 7 is a cross-sectional view of a semiconductor light emitting device according to an example embodiment. FIG. 8 is a cross-sectional view of a light emitting element employable in the semiconductor light emitting device illustrated in FIG. 7.

A semiconductor light emitting device 50A illustrated in FIG. 7 may be understood as being similar to the semiconductor light emitting device 50 illustrated in FIG. 1, except only the disposition of first and second wavelength conversion material P1 and P2. A component according to this example embodiment may be understood with reference to the description of the same or similar component of the semiconductor light emitting device 50, illustrated in FIG. 2, unless otherwise specified.

In this example embodiment, a light-transmitting bonding layer 34 may include a light-transmitting bonding resin containing the first wavelength conversion material P1, and a wavelength conversion film 32 may include the second wavelength conversion material P2. An LED chip 20 may be a blue or ultraviolet (UV) LED chip. The first wavelength conversion material P1 may be a phosphor or a QD converting a portion of light, emitted by the LED chip 20, into light having a first wavelength, different from that of the emitted light. The second wavelength conversion material P2 may be a phosphor or a QD converting a portion of light, emitted by the LED chip 20, into light having a second wavelength shorter than that of the emitted light. For example, the light-transmitting bonding resin may include silicone, epoxy, polyacrylate, polyimide, polyamide, or benzocyclobutene.

A protective resin layer 45A employed in this example embodiment may not contain a wavelength conversion material. Alternatively, the protective resin layer 45A may also contain an additional wavelength conversion material, as needed.

In a semiconductor light emitting device 30A illustrated in FIG. 8, a light-transmitting bonding layer 34 may have a bonding region 34a disposed between a wavelength conversion film 32 and an LED chip 20, and a lateral extending region 34b disposed along lateral surfaces 20C of the LED chip 20. The bonding region 34a of the light-transmitting bonding layer 34 may have an appropriate thickness t for maintaining the bonding strength of the light-transmitting bonding layer 34. For example, the thickness t of the bonding region 34a may vary depending on a component of the light-transmitting bonding layer 34, and may be at least 15 μm. The thickness t of the bonding region 34a may be changed according to the size and amount of a wavelength conversion material such as an employed phosphor, in addition to the bonding strength. In some example embodiments, the thickness t of the bonding region 34a may be determined to be greater than a particle size (d50) (for example, from 5 μm to 40 μm), and when an increased amount of phosphor is required, may be increased to be even greater than the particle size (d50). In some example embodiments, the thickness t, e.g., along the a direction, of the bonding region 34a may be 50 μm or greater.

The first and second wavelength conversion materials P1 and P2 employed in this example embodiment may be divided into the wavelength conversion film 32 and the light-transmitting bonding layer 34 according to a conversion wavelength. While the light-transmitting bonding layer 34 adjacent to the LED chip 20 may include the second wavelength conversion material P2 for providing light having a relatively long wavelength, the wavelength conversion film 32 may include the first wavelength conversion material P1 for providing light having a relatively short wavelength.

The processes (refer to FIGS. 6A through 6E) according to the foregoing example embodiments are illustrated as using a bare LED chip, and conversely, may be performed using a method of previously manufacturing the semiconductor light emitting device 30 illustrated in FIG. 4 and then performing a package manufacturing process.

Figure 9A:
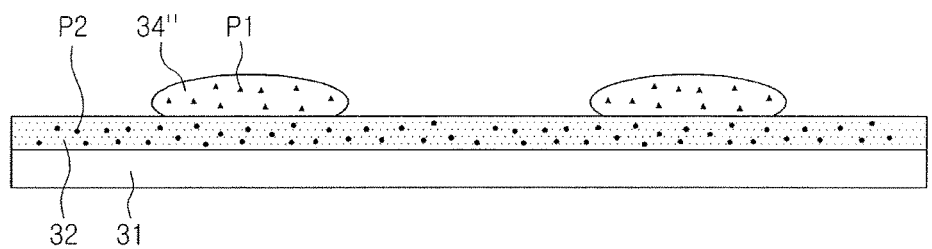
FIGS. 9A through 9C illustrate cross-sectional views of a method of manufacturing the semiconductor light emitting device of FIG. 8.
Figure 9B:
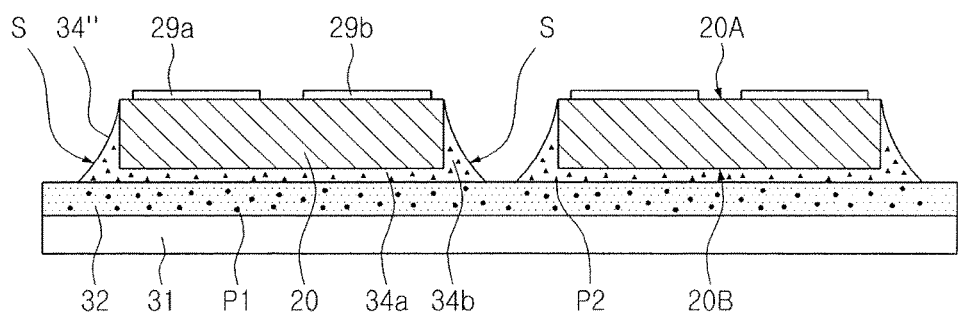
Figure 9C:
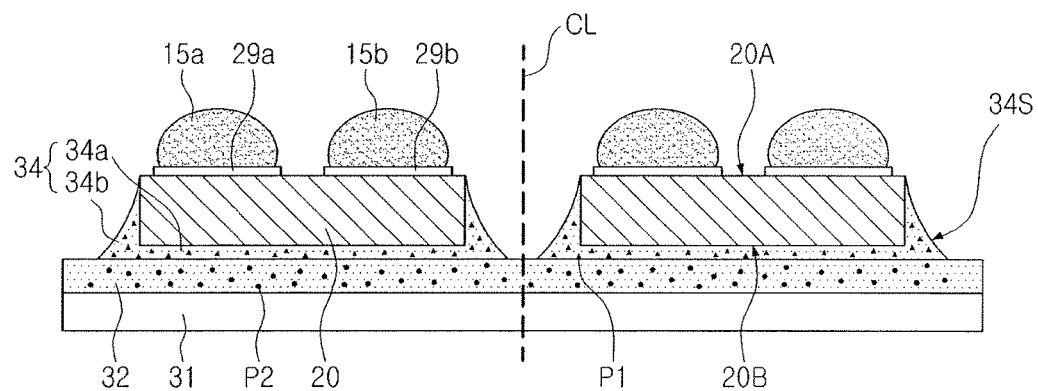

FIGS. 9A through 9C are cross-sectional views of a method of manufacturing the semiconductor light emitting device 30A illustrated in FIG. 8.

Referring to FIG. 9A, the wavelength conversion film 32 may be disposed on a base film 31, and a bonding resin 34" being non-cured may be dripped on the wavelength conversion film 32. The wavelength conversion film 32 may contain the first wavelength conversion material P1.

The wavelength conversion film 32 may be provided in various forms. For example, the wavelength conversion film 32 may be a resin layer or a ceramic film. In some example embodiments, the wavelength conversion film 32 may be a glass layer containing the first wavelength conversion material P1 such as a phosphor or a QD. The glass layer may include glass fired at a low temperature (for example, 400° C. or below). Such a dripping location and area may be regularly arranged in consideration of the area of a desired semiconductor light emitting device.

As illustrated in FIG. 9B, a plurality of LED chips 20 may be disposed on the bonding resin 34". In the deposition process, except an amount of the bonding resin 34" used for the bonding, the bonding resin 34" being non-cured may rise along the lateral surfaces 20C of the semiconductor LED chips 20. A height of the rising and the surface shape of the bonding resin 34" according to the lateral surfaces may be controlled using the viscosity and amount of the bonding resin 34". The viscosity of the bonding resin 34" may be controlled by adding a powder-type thixotropic agent. For example, the powder-type thixotropic agent may be silica particles.

Referring to FIG. 9C, the light-transmitting bonding layer 34 may be formed by curing the bonding resin 34", such that the wavelength conversion film 32 may be bonded to the LED chip 20. The light-transmitting bonding layer 34 may include the bonding region 34a between the wavelength conversion film 32 and the LED chip 20, and the portion of the bonding resin 34", which has flowed along the lateral surfaces of the LED chip 20 in an inclined manner, may be provided as the lateral extending region 34b. As described above, the lateral extending region 34b may provide the inclined surface 34S suitable for light extraction to reduce total internal reflection on the lateral surfaces of the LED chip 20, thus improving light extraction efficiency. In some example embodiments, the inclined surface S may have a concave surface, formed by a bonding resin in a non-cured state, for example, a meniscus shape. Subsequently, the resulting product of FIG. 9C may be cut into device units along a cutting line CL to obtain the semiconductor light emitting device 30A illustrated in FIG. 8.

Figure 10:
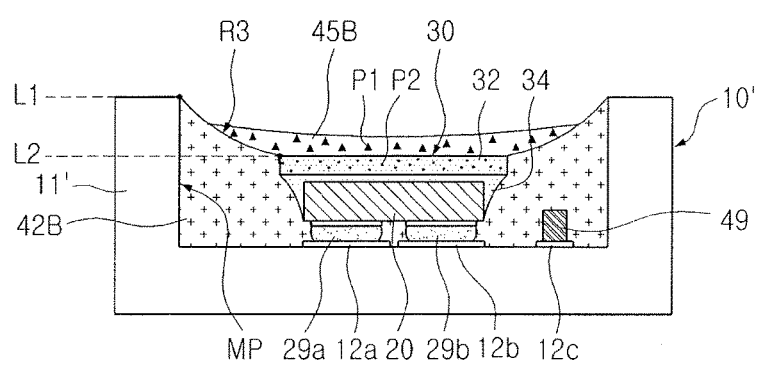
FIG. 10 illustrates a cross-sectional view of a semiconductor light emitting device according to an example embodiment.

FIG. 10 is a cross-sectional view of a semiconductor light emitting device 50B according to an example embodiment. The semiconductor light emitting device 50B illustrated in FIG. 10 may be understood as being similar to the semiconductor light emitting device 50 illustrated in FIG. 1, except for the structure of a package body 10', and the inclusion of a Zener diode 49. A component according to this example embodiment may be understood with reference to the description of the same or similar component of the semiconductor light emitting device 50 illustrated in FIG. 1, unless otherwise specified.

The package body 10' may have a side wall 11' defining a cavity C, similar to the foregoing example embodiments. The side wall 11' may be substantially perpendicular to a bottom surface of the cavity C. In this example embodiment, the package body 10' may provide a reflective surface R3, using an upper surface of a reflective resin portion 42B, instead of having a separate inclined reflective surface of the side wall 11 in previous embodiments.

The upper surface of the reflective resin portion 42B may extend from a first level L1 thereof adjacent to an upper surface of the side wall 11' to a second level L2 thereof adjacent to the LED chip 20, thus providing the inclined reflective surface R3. Again, the upper surface of the side wall 11' having the relatively large angle θ1, here an entirety of the side wall 11' (here the entirety of the sidewall 11' and the main portion are the same), extends further along the z direction than the wavelength conversion film 32 such that the reflective resin portion 42B between the wavelength conversion film 32 and the side wall 11 extends further along the z direction than the wavelength conversion film 32. In other words, the upper surface of the reflective resin portion 42B between the side wall 11' and the LED chip 20 may be higher than the upper surface of the reflective resin portion adjacent to the LED chip 20 and reflective resin portion 42B.

The inclined reflective surface R3 may have a low inclination angle ranging from 20° to 40°, and may have an overall curved surface such as a meniscus shape.

The package body 10' may include a molding resin body in which a reflective powder is dispersed. For example, the reflective powder may include a white ceramic powder such as $TiO_2$, $Al_2O_3$, $Nb_2O_5$, or $ZnO$.

The package body 10' may further include a third wiring electrode 12c for connecting the Zener diode 49, in addition to a first wiring electrode 12a and a second wiring electrode 12b. The third wiring electrode 12c may be on one side of the cavity C, e.g., spaced along the y direction from the LED chip 20. The bottom surface of the cavity C may be a flat surface, and the Zener diode 49 may be on the flat surface along with the LED chip 20 to be electrically connected to the third wiring electrode 12c.

The Zener diode 49 employed in this example embodiment may act as an element absorbing light, but may be surrounded by the reflective resin portion 42B in the cavity C, thus preventing degradation of light extraction efficiency due to the Zener diode 49. As illustrated in FIG. 10, a wavelength conversion resin layer 45B may have a reduced thickness, as compared to the foregoing example embodiments, and the second wavelength conversion material P2 may be densely arranged in the wavelength conversion resin layer 45B.

Figure 11:
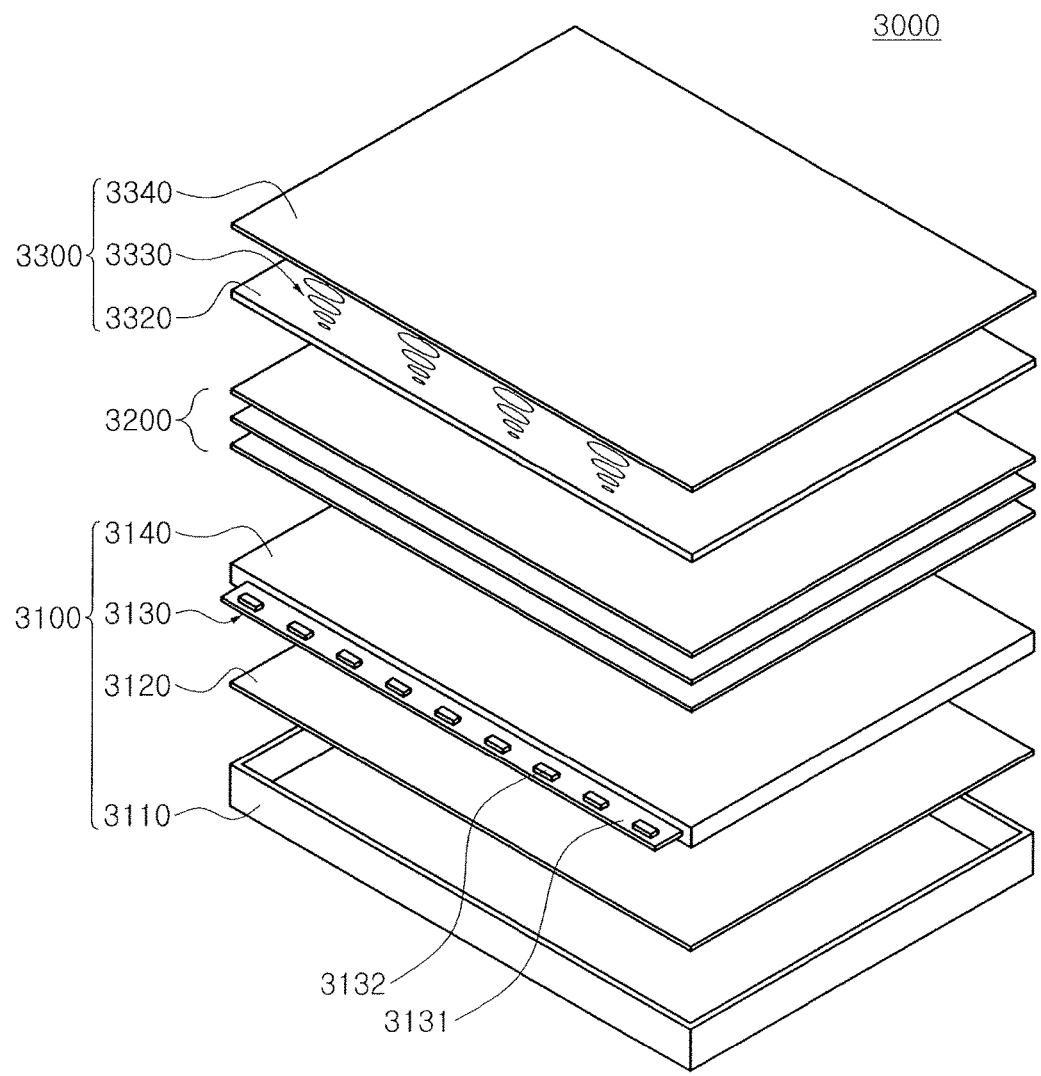
FIG. 11 illustrates an exploded perspective view of a display device according to an example embodiment.

FIG. 11 is an exploded perspective view of a display device according to an example embodiment. Referring to FIG. 11, a display device 3000 may include a backlight unit 3100, an optical sheet 3200, and an image display panel 3300, e.g., a liquid crystal display panel.

The backlight unit 3100 may include a bottom case 3110, a reflector 3120, a light guide plate 3140, and a light source module 3130 provided on at least one surface of the light guide plate 3140. The light source module 3130 may include a printed circuit board (PCB) 3131 and a light source 3132. The light source 3132 may be a semiconductor light-emitting device according to the example embodiments described above.

The optical sheet 3200 may be between the light guide plate 3140 and the image display panel 3300, and may include various kinds of sheets, such as a diffusion sheet, a prism sheet, and a protection sheet.

The image display panel 3300 may display an image, using light emitted through the optical sheet 3200. The image display panel 3300 may include an array substrate 3320, a liquid crystal layer 3330, and a color filter substrate 3340. The array substrate 3320 may include pixel electrodes disposed in a matrix, thin film transistors applying a driving voltage to the pixel electrodes, and signal lines operating the thin film transistors. The color filter substrate 3340 may include a transparent substrate, a color filter, and a common electrode. The color filter may include filters selectively passing light having a certain wavelength out of white light emitted by the backlight unit 3100. The liquid crystal layer 3330 may be re-arranged by an electrical field generated between the pixel electrodes and the common electrode to adjust light transmittance. Light with adjusted light transmittance may be projected to display an image by passing through the color filter of the color filter substrate 3340. The image display panel 3300 may further include a driving circuit unit, or the like, processing an image signal.

Figure 12:
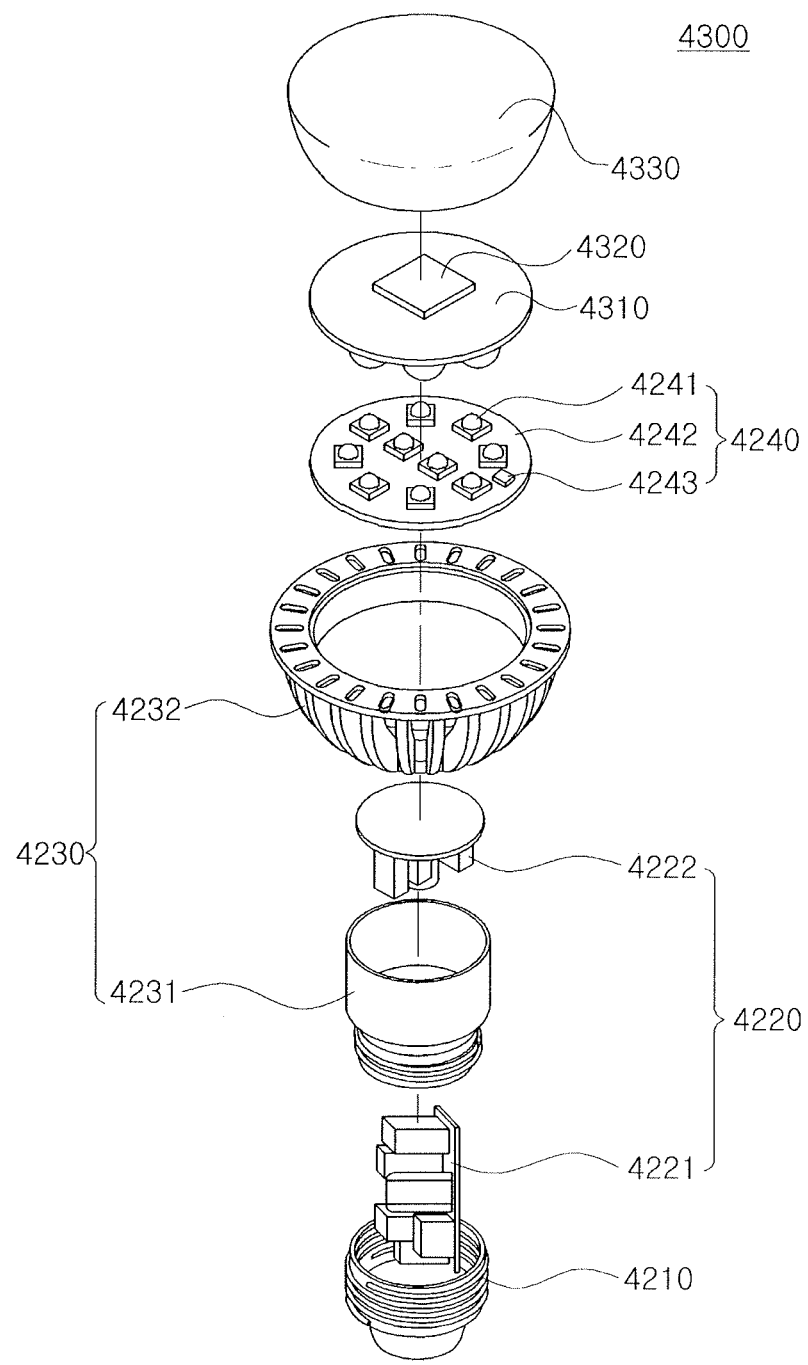
FIG. 12 illustrates an exploded perspective view of a bulb-type lighting device according to an example embodiment.

FIG. 12 is an exploded perspective view of a bulb-type lighting device according to an example embodiment. Referring to FIG. 12, a lighting apparatus 4300 may include a socket 4210, a power supply 4220, a heat dissipation portion 4230, a light source module 4240, and an optical portion 4330. According to an example embodiment, the light source module 4240 may include an LED array, and the power supply 4220 may include an LED driver.

The socket 4210 may replace that of a conventional lighting device. Power supplied to the lighting device 4300 may be applied through the socket 4210. As illustrated in FIG. 12, the power supply 4220 may be attached to a first power supply 4221 and a second power supply 4222. The heat dissipation portion 4230 may include an internal heat dissipation portion 4231 and an external heat dissipation portion 4232. The internal heat dissipation portion 4231 may be directly connected to the light source module 4240 or the power supply 4220 to thus transfer heat to the external heat dissipation portion 4232. The optical portion 4330 may include an internal optical portion (not illustrated) and an external optical portion (not illustrated), and may evenly scatter light emitted by the light source module 4240.

The light source module 4240 may receive power from the power supply 4220 to emit light to the optical portion 4330. The light source module 4240 may include at least one light source 4241, a circuit board 4242, and a controller 4243, and the controller 4243 may store operating information of the at least one light source 4241, for example, LEDs.

The light source 4241 may be a semiconductor light-emitting device according to the example embodiments described above.

The lighting device 4300 according to this example embodiment may include a reflector 4310 disposed above the light source module 4240, and the reflector 4310 may reduce glare by evenly spreading light emitted by the at least one light source 4241 to a side and rear of the reflector 4310.

A communications module 4320 may be mounted on an upper portion of the reflector 4310, through which home-network communications may be implemented. For example, the communication module 4320 may be a wireless communications module using Zigbee®, wireless fidelity (Wi-Fi), or light fidelity (Li-Fi), and may control on/off functions and brightness of a lighting device installed in and around the home through a smartphone or wireless controller. Further, use of a Li-Fi communications module, using a visible light wavelength of a lighting device installed in and around residential, commercial, or industrial spaces, may control electronics such as a television, a refrigerator, an air-conditioner, a door lock, or may control a vehicle. The reflector 4310 and the communications module 4320 may be covered by the optical portion 4330.

As set forth above, according to the example embodiments, different wavelength conversion materials may be distributed and disposed in components which are positioned in different positions on a light emission path, thus preventing the loss of converted light. Light extraction efficiency may be improved by providing a reflective surface suitable for light extraction, while having structural stability. The loss of light by a light absorption element of a package, for example, a conductive bump or a Zener diode, may be reduced or prevented using a reflective resin portion. The reflective resin may protrude above the LED chip along the z direction, e.g., may have an upper surface that abuts an upper surface of the wavelength conversion film adjacent thereto and extends to the side wall, e.g., a portion of the side wall having the angle the angle θ1, that is higher along the z direction than the wavelength conversion film. In other words, the upper surface of the reflective resin portion contacting the side wall may be higher than the upper surface of the reflective resin portion adjacent to the LED chip, e.g., the upper surface of the reflective resin portion extending between the side wall and the LED chip is higher than the LED chip.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light emitting device, comprising:
a package body having a cavity surrounded by a side wall, and a first wiring electrode, and a second wiring electrode on a bottom surface of the cavity;
a light emitting diode (LED) chip having a first surface with a first electrode and a second electrode thereon, a second surface opposing the first surface, and lateral surfaces between the first surface and the second surface, the LED chip being mounted in the cavity such that the first surface faces the bottom surface;
conductive bumps connecting the first electrode and the second electrode to the first wiring electrode and the second wiring electrode, respectively;
a wavelength conversion film on the second surface of the LED chip, and including a first wavelength conversion material;
a light-transmitting bonding layer between the second surface of the LED chip and the wavelength conversion film to bond the LED chip to the wavelength conversion film;
a reflective resin portion in the cavity to surround the LED chip and fill a space between the first surface of the LED chip and the bottom surface of the cavity; and
a wavelength conversion resin layer on the wavelength conversion film and the reflective resin portion, and having a light-transmitting resin, the light-transmitting resin including a second wavelength conversion material.

2. The semiconductor light emitting device as claimed in claim 1, wherein an upper surface of the reflective resin portion has a curved inclined surface.

3. The semiconductor light emitting device as claimed in claim 2, wherein the upper surface of the reflective resin portion contacting the side wall is higher than the upper surface of the reflective resin portion adjacent to the LED chip.

4. The semiconductor light emitting device as claimed in claim 2, wherein the side wall of the package body has an inclined reflective surface.

5. The semiconductor light emitting device as claimed in claim 4, wherein the curved inclined surface of the reflective resin portion is connected to the inclined reflective surface.

6. The semiconductor light emitting device as claimed in claim 4, wherein the wavelength conversion resin layer extends to the inclined reflective surface of the side wall.

7. The semiconductor light emitting device as claimed in claim 1, wherein the first wavelength conversion material and the second wavelength conversion material convert light, emitted by the LED chip, into light having different wavelengths.

8. The semiconductor light emitting device as claimed in claim 7, wherein the first wavelength conversion material includes a red phosphor, and the second wavelength conversion material includes at least one of a green phosphor and a yellow phosphor.

9. The semiconductor light emitting device as claimed in claim 1, wherein the light-transmitting bonding layer includes a laterally extending region, the laterally extending region extending to the lateral surfaces of the LED chip and having an inclined surface that is inclined toward the bottom surface, and the reflective resin portion is formed along the inclined surface of the laterally extending region.

10. The semiconductor light emitting device as claimed in claim 1, wherein the light-transmitting bonding layer includes a light-dispersing powder.

11. The semiconductor light emitting device as claimed in claim 1, wherein the first wavelength conversion material is contained in an amount of 5 vol % to 30 vol %, based on total volume of the wavelength conversion film.

12. The semiconductor light emitting device as claimed in claim 1, further comprising a Zener diode disposed on the bottom surface of the cavity and surrounded by the reflective resin portion, wherein the bottom surface of the cavity is a flat surface.

13. A semiconductor light emitting device, comprising:
a package body having a cavity surrounded by a side wall having a first reflective surface, the first reflective surface being inclined, the package body having a first wiring electrode and a second wiring electrode disposed on a bottom surface of the cavity;
a semiconductor light emitting element mounted on the bottom surface of the cavity, and having a first electrode and a second electrode connected to the first wiring electrode and the second wiring electrode, respectively;
a reflective resin portion in the cavity to surround the semiconductor light emitting element, having a curved upper surface providing a second reflective surface connected to the first reflective surface, and filling a space between the semiconductor light emitting element and the bottom surface of the cavity; and
a wavelength conversion resin layer on the semiconductor light emitting element,
wherein the semiconductor light emitting element further includes:
an LED chip having a first surface with a first electrode and a second electrode disposed thereon, the first surface facing the bottom surface of the cavity, a second surface opposing the first surface, and lateral surfaces between the first surface and the second surface;
a wavelength conversion film disposed on the second surface of the LED chip, and below the wavelength conversion resin layer; and
a light-transmitting bonding layer disposed between the second surface of the LED chip and the wavelength conversion film to bond the LED chip to the wavelength conversion film, extending to the lateral surfaces of the LED chip, and having a surface inclined toward the bottom surface,
wherein the wavelength conversion resin layer includes a first wavelength conversion material, and the wavelength conversion film includes a second wavelength conversion material.

14. The semiconductor light emitting device as claimed in claim 13, wherein the first wavelength conversion material includes a red phosphor, and the second wavelength conversion material includes at least one of a green phosphor and a yellow phosphor.

15. The semiconductor light emitting device as claimed in claim 13, wherein the wavelength conversion resin layer extends along the second reflective surface of the reflective resin portion and the first reflective surface of the side wall.

16. A semiconductor light emitting device, comprising:
a package body having a cavity surrounded by a side wall, and having a first wiring electrode and a second wiring electrode on a bottom surface of the cavity;
an LED chip having a first surface with a first electrode and a second electrode disposed thereon, a second surface opposing the first surface, and lateral surfaces between the first surface and the second surface, the LED chip being mounted in the cavity such that the first surface faces the bottom surface;
conductive bumps connecting the first electrode and the second electrode to the first wiring electrode and the second wiring electrode, respectively;
a wavelength conversion film on the second surface of the LED chip, and including a first wavelength conversion material;
a light-transmitting bonding layer between the second surface of the LED chip and the wavelength conversion film to bond the LED chip to the wavelength conversion film, and including a light-transmitting bonding material, the light-transmitting bonding material including a second wavelength conversion material; and
a reflective resin portion in the cavity to surround the LED chip, and filling a space between the first surface of the LED chip and the bottom surface of the cavity.

17. The semiconductor light emitting device as claimed in claim 16, wherein the first wavelength conversion material includes at least one of a green phosphor and a yellow phosphor, and the second wavelength conversion material includes a red phosphor.

18. The semiconductor light emitting device as claimed in claim 16, wherein the light-transmitting bonding layer includes a laterally extending region extending to the lateral surfaces of the LED chip and having a surface inclined toward the bottom surface, the laterally extending region including the first wavelength conversion material.

19. The semiconductor light emitting device as claimed in claim 16, wherein the side wall of the cavity has a first reflective surface, the first reflective surface being inclined, and the reflective resin portion has a second reflective surface connected to the first reflective surface and curved.

20. The semiconductor light emitting device as claimed in claim 16, further comprising a light-transmitting resin layer on the wavelength conversion film and the reflective resin portion in the cavity.

* * * * *